United States Patent [19]

Kosa et al.

[11] Patent Number: 5,126,285
[45] Date of Patent: Jun. 30, 1992

[54] METHOD FOR FORMING A BURIED CONTACT

[75] Inventors: Yasunobu Kosa; John H. Sweeney; Scott S. Roth, all of Austin, Tex.

[73] Assignee: Motorola, Inc., Schaumburg, Ill.

[21] Appl. No.: 546,974

[22] Filed: Jul. 2, 1990

[51] Int. Cl.⁵ .................. H01L 21/283; H01L 21/225
[52] U.S. Cl. ...................... 437/191; 437/31; 437/162
[58] Field of Search .............. 437/191, 195, 180, 918, 437/984, 162, 160, 44, 193, 31; 148/DIG. 31

[56] References Cited

U.S. PATENT DOCUMENTS

| | | | |
|---|---|---|---|
| 4,240,196 | 12/1980 | Jacobs | 437/191 |
| 4,374,700 | 2/1983 | Scott | 437/56 |
| 4,397,076 | 8/1983 | Honnigford | 437/41 |
| 4,483,726 | 11/1984 | Isaac | 437/162 |
| 4,531,282 | 7/1985 | Sakai | 437/162 |
| 4,795,719 | 1/1989 | Eitan | 437/984 |
| 4,824,794 | 4/1989 | Tabata | 437/191 |
| 4,830,972 | 5/1989 | Hamasaki | 437/191 |
| 4,892,837 | 1/1990 | Kudo | 437/33 |
| 4,966,864 | 10/1990 | Pfiester | 437/191 |

OTHER PUBLICATIONS

Ghandhi, S. K., *VLSI Fabrication Principles, Silicon & Golcium Arsenide*, John Wiley & Sons, (1983), p. 373.

Primary Examiner—T. N. Quach
Attorney, Agent, or Firm—James L. Clingan, Jr.

[57] ABSTRACT

A buried contact in a semiconductor device is formed by forming an oxide layer on a surface of a semiconductor substrate. A heavily-doped polysilicon layer is formed over the oxide layer and selectively etched to leave a first portion of the polysilicon layer over the surface and remove a second portion of the polysilicon layer from over the surface. The remaining first portion of polysilicon has a vertical surface which is over the surface of the substrate. After this step there is oxide between the first portion of the polysilicon layer and the substrate. An isotropic etch is performed which removes a portion of the oxide between the first portion of the polysilicon layer and the substrate to leave a void between the first portion of the polysilicon layer and the surface of the substrate from the vertical surface of the first portion of the polysilicon to a predetermined distance from the vertical surface of the first portion of the polysilicon layer. A polysilicon layer is then deposited which fills the void with polysilicon. The polysilicon which is not filling the void is removed. An implant is then performed using the first portion of the polysilicon layer as a mask to form a first doped region in the substrate adjacent to the vertical surface of the first portion of the polysilicon layer. Because the polysilicon layer was doped, dopant from the first portion of the polysilicon layer migrates down through the polysilicon filling the void to form a second doped region in the substrate under the first portion of the polysilicon layer which merges with the first doped region in the substrate. This has the effect making electrical contact between the first portion of the polysilicon layer and the first doped region in the substrate and thus achieving a desired buried contact.

2 Claims, 3 Drawing Sheets

METHOD FOR FORMING A BURIED CONTACT

FIELD OF THE INVENTION

The invention relates to methods useful in the manufacture or integrated circuits, and more particularly, to methods for making buried contacts.

BACKGROUND OF THE INVENTION

Many integrated circuits make use of what is known as a buried contact. A buried contact is an electrical contact formed by the physical contact of a polysilicon layer (a layer which is at least substantially polycrystalline silicon) to a doped region in a semiconductor substrate. This type of contact is most common in MOS type circuits. The desirability of being able to selectively make electrical contact between a polysilicon layer and a doped region in the substrate is well known. This ability is critical, for example, to most static random access memories (SRAMs).

One of the characteristics of buried contacts, the physical contact between a polysilicon layer and the substrate creates a problem in etching. Typically, the substrate is exposed and a polysilicon layer is deposited in physical contact with the substrate. The polysilicon layer is then etched to leave polysilicon only where it is needed. This etching occurs in part on a portion of the area where there is physical contact between polysilicon and substrate which is also typically silicon. This etch process includes some amount of over-etch to ensure that all of the polysilicon is removed where it is intended to be removed. This means that the etch process will continue after the polysilicon in most areas has been removed. After the polysilicon has been removed in the location which is in contact with the substrate, the substrate is etched. A typical amount of over-etch is 20%. Thus, for a 4000 Angstrom polysilicon layer, there will be 800 Angstroms etched out of the substrate because it, being silicon, is etched at virtually the same rate as the polysilicon layer. This over-etching and the consequent etching into the substrate, called pitting, tends to result in defects at those pitted locations in the substrate.

SUMMARY OF THE INVENTION

Accordingly, it is an object of the present invention to provide an improved method for forming a buried contact.

There is described a method useful in making semiconductor devices in a semiconductor substrate of a first conductivity type having a surface. A first layer of insulating material is formed on the surface of the substrate. A polysilicon layer is formed having dopant material therein and is on the first layer of insulating material. The polysilicon layer is etched to leave a first portion of polysilicon on the surface of the substrate and to make a vertical surface on the first portion of polysilicon over the surface of the substrate. A portion of the first layer of insulating material under the first portion of polysilicon is etched away to form an undercut region under the first portion of polysilicon from the vertical surface to a predetermined distance from the vertical surface. The undercut region is filled with polysilicon. A portion of the dopant material is caused to migrate to a first region of the substrate under the undercut region via the polysilicon in the undercut region.

DETAILED DESCRIPTION OF THE INVENTION

Figure 1:
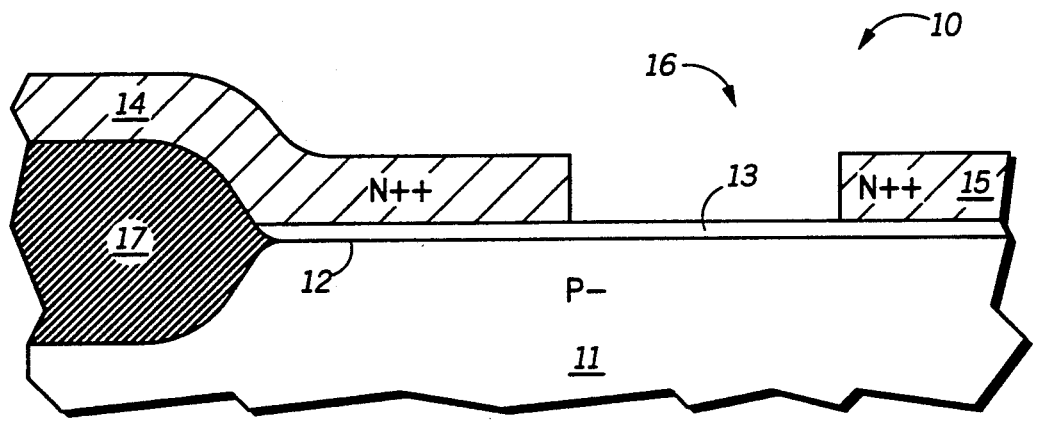
FIG. 1 is a cross-section of a semiconductor device at a stage in processing according to the method of the preferred embodiment of the invention.
Figure 2:
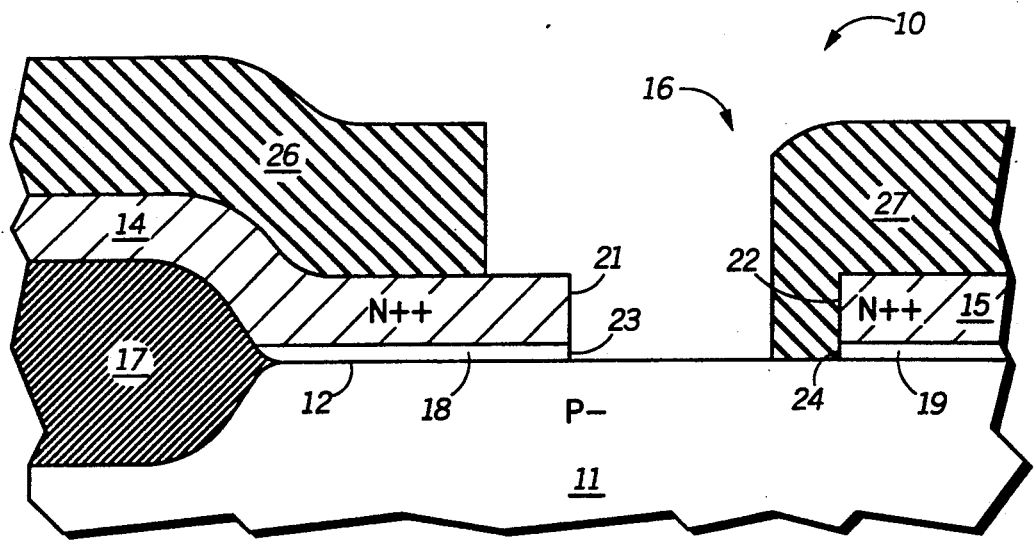
FIG. 2 is a cross-section of the semiconductor device at a subsequent stage in processing to that of FIG. 1 according to the method of the preferred embodiment of the invention.

Shown in FIG. 1 is a semiconductor structure 10 of a semiconductor device comprised of a silicon substrate 11 having a surface 12, a thin oxide layer 13 of a thickness, for example, of about 150 Angstroms on surface 12, a polysilicon layer 14 of a thickness, for example, of about 4000 Angstroms on oxide layer 13, a polysilicon layer 15 of a thickness, for example, of about 4000 Angstroms on oxide layer 13 with a space 16 between polysilicon layers 14 and 15 where there is an exposed portion of oxide layer 13, and a field oxide 17. Polysilicon layer 14 extends over field oxide 17. Polysilicon layers 14 and 15 are heavily doped to N++. Substrate 11 is lightly doped to P−. Substrate 11 is shown as P− for the presently described embodiment in anticipation of making N channel transistors but could also be N-type for making P channel transistors. Similarly, polysilicon layers 14 and 15 could be P-type if contact was to be made to a P-type region. Substrate 11 could also be a well within a larger semiconductor substrate. The configurations shown in FIG. 1 is very nearly the same as for a common buried contact in a MOS integrated circuit. The common buried contact would be formed by removing a portion of the thin oxide layer where polysilicon layer 14 is now located before depositing the polysilicon. A polysilicon layer would then be deposited, and a subsequent etch of the polysilicon would result in the polysilicon being in two pieces arranged the same as polysilicon layers 14 and 15. One of pieces would be for making the buried contact and the other would be for the gate of a MOS transistor. The difference between the common buried contact and the configuration of FIG. 1 is that one of the pieces would be in physical contact with the surface of the substrate, whereas, as shown in FIG. 1, both polysilicon layers 14 and 15 are separated from surface 12 of substrate 11 by oxide layer 13. The structure of FIG. 1 is obtained by conventional means. Field oxide 17 is formed and surface 12 is exposed on which oxide layer 13 is grown. Polysilicon is deposited and etched to leave polysilicon layers 14 and 15 with space 16 therebetween.

Oxide layer 13 in space 16 is etched using polysilicon layers 14 and 15 as a mask to leave an oxide layer 18 and an oxide layer 19 as shown in FIG. 1. The etch is preferably anisotropic, such as a reactive ion etch (RIE) to avoid etching oxide under polysilicon layer 15. An isotropic which is carefully controlled may also be used. In the alternative this step could be skipped. After the portion of oxide layer 13 in space 16 is removed, photoresist is applied and patterned to expose a portion of polysilicon layer 14. Polysilicon layers 14 and 15 have vertical surfaces 21 and 22, respectively. Similarly, oxide layers 18 and 19 have vertical surfaces 23 and 24, respectively. The photoresist, after being patterned, has a portion 26 and a portion 27. Portion 26 is over a portion of polysilicon layer 14, and portion 27 is over polysilicon layer 15. In the case of portion 26, vertical wall 21 of polysilicon layer 14 and vertical wall 23 oxide layer 18 are exposed. In the case of portion 27, vertical wall 22 of polysilicon layer 15 and vertical wall 24 of oxide layer 19 are covered by photoresist portion 27.

Figure 3:
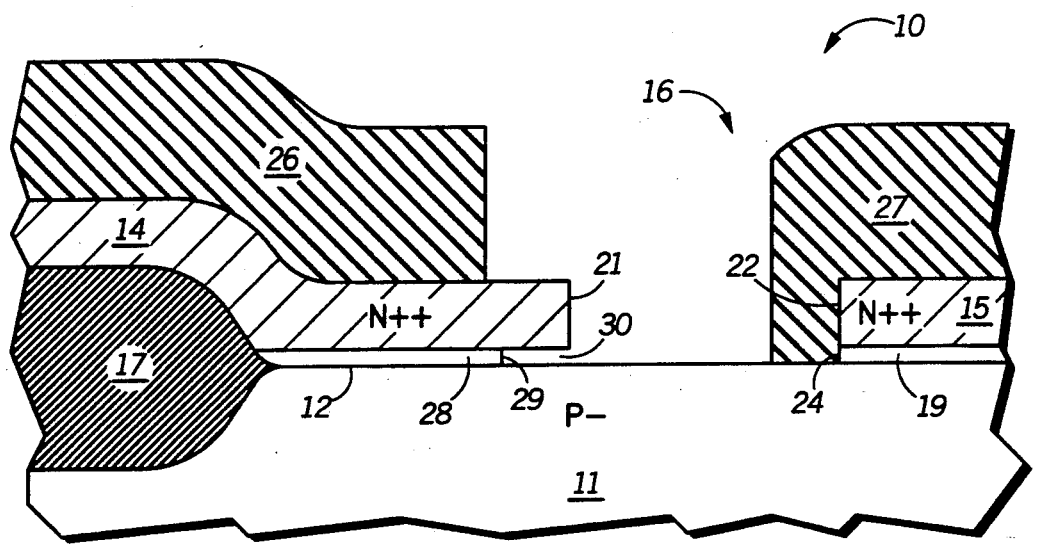
FIG. 3 is a cross-section of the semiconductor device at a subsequent stage in processing to that of FIG. 2 according to the method of the preferred embodiment of the invention.
Figure 4:
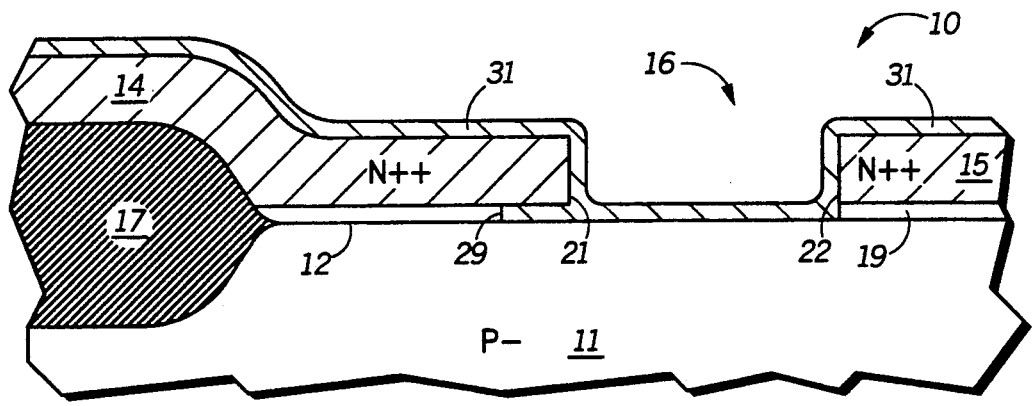
FIG. 4 is a cross-section of the semiconductor device at a subsequent stage in processing to that of FIG. 3 according to the method of the preferred embodiment of the invention.

An isotropic oxide etch is then performed to etch oxide layer 18 beginning at vertical surface 23. Chemicals which etch isotropically with a high degree of selectivity between oxide and polysilicon are well known. This etch is continued until oxide layer 18 is etched about 2000 Angstroms under polysilicon layer 14 from vertical 21. This undercutting of oxide which is under polysilicon is a common characteristic of isotropic etching. One of the main uses of anisotropic etches, such as RIE, is in situations where it is desirable to avoid undercutting. This undercutting, as shown in FIG. 3, leaves an oxide layer 28 under polysilicon layer 14 which extends from field oxide 17 to about 2000 Angstroms short of vertical wall 21. Oxide layer 28 has a vertical surface 29. There is thus an undercut region 30 between vertical surface 29 of oxide layer 28 and vertical surface 21 of polysilicon layer 14.

Photoresist portions 26 and 27 are removed and a thin polysilicon layer 31 is deposited. Polysilicon is deposited very conformally so that polysilicon layer 31 completely fills undercut region 30 between oxide layer 28 and vertical wall 21. The thin polysilicon layer may need be only about 150 Angstroms or less. As polysilicon is deposited in undercut region 30, polysilicon adheres to both surface 12 of substrate 11 and to the underside of polysilicon layer 14 which is in undercut region 30. Since oxide layer 13 that was etched was about 150 Angstroms, the height of the undercut region where a portion of oxide layer 13 was removed is also about 150 Angstroms. Thus, since the polysilicon forms from both the top and bottom of undercut region 30, a 75 Angstrom thickness of polysilicon is sufficient to fill undercut region 30 with polysilicon. Thus, a 150 Angstrom thickness for polysilicon layer 31 is about twice the minimum thickness necessary to fill undercut region 30 with polysilicon. Accordingly, one may find it desirable to use an even thinner layer of polysilicon. Polysilicon layer 31 is selected to be of sufficient thickness to ensure that undercut region 30 is filled with polysilicon which is related to the thickness of oxide layer 28 under polysilicon layer 14.

Figure 5:
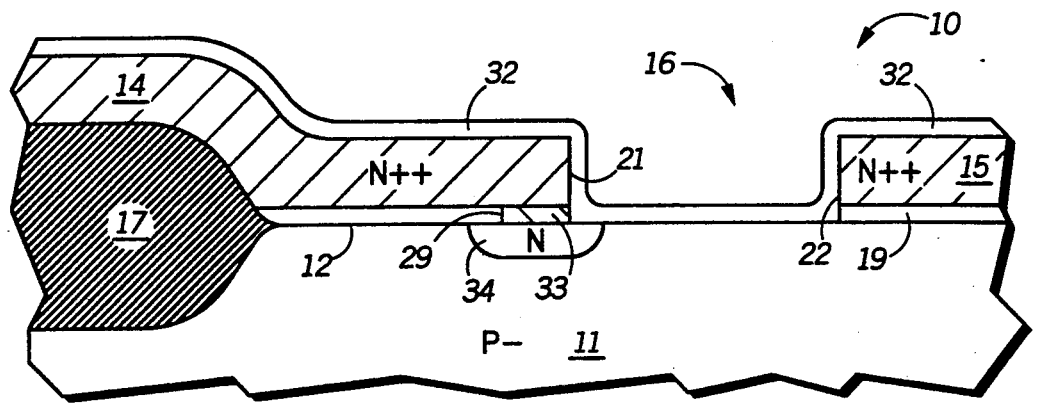
FIG. 5 is a cross-section of the semiconductor device at a subsequent stage in processing to that of FIG. 4 according to the method of the preferred embodiment of the invention.
Figure 6:
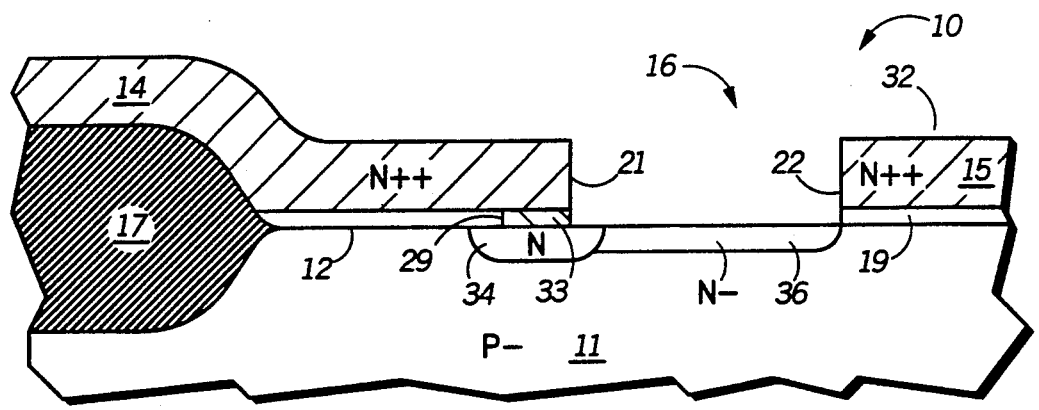
FIG. 6 is a cross-section of the semiconductor device at a subsequent stage in processing to that of FIG. 5 according to the method of the preferred embodiment of the invention.

The portion of polysilicon layer 31 not filling undercut region 30 is then removed. This removal can be achieved by directly etching polysilicon layer 31 or by first oxidizing polysilicon layer 31 to form an oxide layer 32 as shown in FIG. 5 which is then removed using an oxide etch to leave a polysilicon fill 33 in undercut region 30. Oxide layer 32 is only somewhat thicker than polysilicon layer 31 because all that needs to be oxidized is polysilicon layer 31 which is quite thin. It is important that all of polysilicon layer 31 along vertical walls 22 and 24 of polysilicon layer 15 and oxide layer 19 be oxidized because there should be no remaining polysilicon between surface 12 of substrate 11 and polysilicon layer 15. This oxidizing process requires heat and consequently, N-type dopant migrates into polysilicon fill 33 and from polysilicon fill 33 to substrate 11 to form an N-type region 34 in substrate 11 under polysilicon fill 33 as shown in FIG. 5. Using polysilicon layers 14 and 15 as a mask, a light N-type implant is performed. Oxide layer 32 may be removed before this implant and a subsequent thin oxide grown or this implant can be through oxide layer 32. The result of this implant is shown in FIG. 6 in which there is an N-type region 36 formed in substrate 11 between polysilicon layers 14 and 15. At this stage region 34 and region 36 are at least partially merged.

Figure 7:
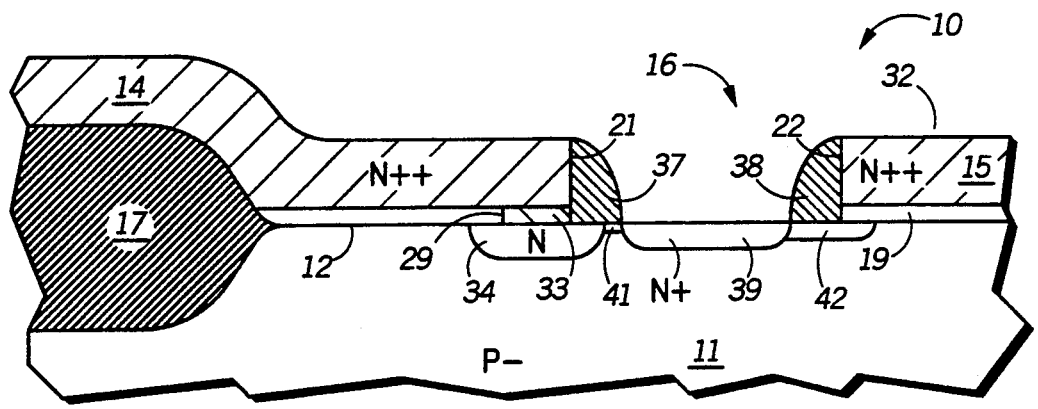
FIG. 7 is a cross-section of the semiconductor device at a subsequent stage in processing to that of FIG. 6 according to the method of the preferred embodiment of the invention.

Sidewalls spacers 37 and 38 are formed along vertical walls 21 and 22 of polysilicon layers 14 and 15, respectively, as shown in FIG. 7. These sidewall spacers are formed by any conventional means and material. Typical materials for sidewalls spacers are lwo temperature oxide (LTO), nitride, and polysilicon. Sidewall spacer 37 and 38 are are shown as being in contact with surface 12 of substrate 11 which would make polysilicon an inappropriate choice. An oxide layer, however, may be formed between polysilicon layers 14 and 15 prior to formation of sidewall spacers 37 and 38 in which case polysilicon may be the material chosen for sidewall spacers. Sidewall spacers 37 and 38 are chosen to be of a material and of sufficient height so as to prevent implanted ions from reaching the portion of surface 12 of substrate 11 which is underneath sidewall spacers 37 and 38. After formation of sidewall spacers 37 and 38, there is performed a heavy N-type implant to form heavily-doped N-type region 39 in substrate 11 between sidewall spacers 37 and 38. This heavy N-type implant is also into region 36 which has the effect of making two lightly-doped regions 41 and 42. Lightly-doped region 41 is under sidewall spacer 37 and between regions 34 and 39. Lightly-doped region 42 is under sidewalls spacer 38 and adjacent to region 39.

Figure 8:
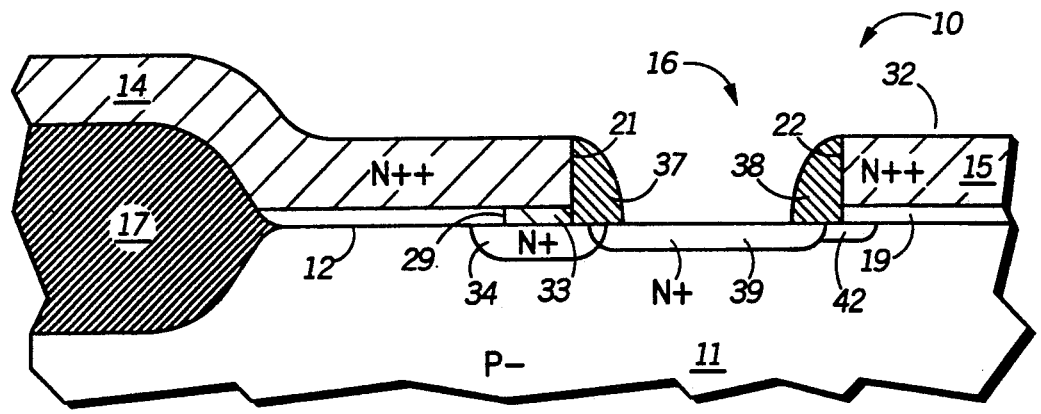
FIG. 8 is a cross-section of the semiconductor device at a subsequent stage in processing to that of FIG. 7 according to the method of the preferred embodiment of the invention.

An annealing step causes additional diffusion of the dopants from polysilicon layer 14 into polysilicon fill 33 and further into region 34 and the additional migration of dopants within regions 34 and 39 so that the two regions merge as shown in FIG. 8. An annealing step is a conventional step following an implant. Region 39 is a doped region in substrate 11 which could be used as a source or drain for a transistor in which polysilicon layer 15 is the gate. The physical relation between polysilicon layer 15 and regions 39 and 42 is typical for a lightly-doped-drain (LDD) transistor. Polysilicon fill 33 is in physical contact with both polysilicon layer 14 and region 34 which is a heavily-doped region in substrate 11. Because region 34, polysilicon layer 14, and polysilicon fill are all heavily-doped to the same conductivity type, there is good electrical contact among them.

As an alternative, polysilicon layers 14 and 15 could be undoped until this heavy N-type implant. In such case polysilicon layers 14 and 15 would not become doped until substrate became doped. Polysilicon layers 14 and 15 would receive the light implant and the heavy implant. There would be no doped region below the undercut region until there was some sufficient heat to drive the dopants down polysilicon layers 14 and 15. This is done necessarily anyway though to set the implants into substrate 11. Thus, the heating required to cause dopant diffusion from polysilicon layer 14 to the polysilicon fill and on into the substrate is a required step so there is no additional processing required to obtain the necessary doped region into the substrate under the undercut region. This annealing step is sufficiently long to drive the dopants into the substrate to form the necessary doped region as well provide lateral diffusion to merge with the heavy implant in the substrate. In fact the time for the dopants to reach the substrate from polysilicon layer 14 essentially negligible compared to the total anneal time. In the situation where there is no sidewall formation to mask the heavy implant, then the amount of lateral diffusion required to obtain the desired merger is negligible and not any problem either. The rapid downward diffusion of dopants in deposited polysilicon as well known as being due to grain boundaries.

Thus, the requisite feature of a buried contact which is making electrical contact between polysilicon and a doped region in a substrate is achieved. The buried contact of FIG. 8 is to region 39 which can conveniently be a source or drain of an N-channel transistor. The buried contact, however, may be with a doped region in the substrate which has a different purpose than that of a source or drain. The doped region to which contact is made also may not be adjacent to another polysilicon layer such as polysilicon layer 15. Polysilicon is the desired material for making contact but there may be an equivalent material with the conformal, electrical, and dopant-migrating characteristics which could also be used.

While the invention has been described in a specific embodiment, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A method for making a buried contact in a semiconductor substrate of a first conductivity type having a surface, comprising the step of:

forming a first layer of insulating material on the surface of the substrate;

forming a polysilicon layer having dopant material therein on the first layer of insulating material;

etching the polysilicon layer to leave a first portion of polysilicon on the surface of the substrate and to remove a second portion of polysilicon adjoining the first portion to make a vertical surface on the first portion of polysilicon over the surface of the substrate and to expose a first portion of the first layer of insulating material which had been under the second portion of polysilicon and leave a second portion of the first layer of insulating material under the first portion of polysilicon;

removing the first portion of the first layer of insulating material to expose a first portion of the substrate adjacent to the vertical surface of the first portion of polysilicon;

applying a masking material over the first portion of polysilicon and the first portion of the substrate;

removing a portion of the masking material over the vertical surface adjacent thereto to expose a portion, adjacent to the substrate, of the first portion of the substrate;

etching the second portion of the first layer of insulating material with an isotropic etch to remove portions of the insulating material under the first portion of polysilicon to form an undercut region under the first portion of polysilicon from the vertical surface to a predetermined distance from the vertical surface;

removing the masking material;

conformally depositing polysilicon to form a thin layer of polysilicon on the first portion of polysilicon, the vertical surface of the first portion of the polysilicon, and on the first portion of the substrate, and to fill the undercut region with polysilicon;

applying an oxidizing chemical to the thin layer of polysilicon to oxidize the thin layer of polysilicon and thereby form a thin layer of oxide on the first portion of polysilicon, the vertical wall, and the first portion of the substrate;

removing the thin layer of oxide with an etchant which is highly selective between oxide and silicon;

forming a first region of a second conductivity type in the substrate adjacent to the vertical surface;

causing a portion of the dopant material to migrate to a second region of the substrate under the undercut region via the polysilicon in the undercut region; and causing lateral expansion of the first and second regions to cause the merger thereof whereby electrical contact is made between the first portion of polysilicon and the first region in the substrate.

2. A method for making a buried contact in a semiconductor substrate of a first conductivity type having a surface, comprising the steps of:

forming a first layer of insulating material in the surface of the substrate;

forming a polysilicon layer having dopant material therein on the first layer of insulating material;

etching the polysilicon layer to leave a first portion of polysilicon on the surface of the substrate and to remove a second portion of polysilicon adjoining the first portion to make a vertical surface on the first portion of polysilicon over the surface of the substrate and to expose a first portion of the first layer of insulating material which had been under the second portion of polysilicon and leave a second portion of the first layer of insulating material under the first portion of polysilicon;

removing the first portion of the first layer of insulating material to expose a first portion of the substrate adjacent to the vertical surface of the first portion of polysilicon;

applying a masking material over the first portion of polysilicon and the first portion of the substrate;

removing a portion of the masking material over the vertical surface adjacent thereto to expose a portion, adjacent to the substrate, of the first portion of the substrate;

etching the second portion of the first layer of insulating material with an isotropic etch to remove portions of the insulating material under the first portion of polysilicon to form an undercut region under the first portion of polysilicon from the vertical surface to a predetermined distance from the vertical surface;

removing the masking material;

conformally depositing polysilicon to form a thin layer of polysilicon on the first portion of polysilicon, the vertical surface of the first portion of the polysilicon, and on the first portion of the substrate, and to fill the undercut region with polysilicon;

applying an oxidizing chemical to the thin layer of polysilicon to oxidize the thin layer of polysilicon and thereby form a thin layer of oxide on the first portion of polysilicon, the vertical wall, and the first portion of the substrate;

removing the thin layer of oxide with an etchant which is highly selective between oxide and silicon;

forming a first region of a second conductivity type in the substrate adjacent to the vertical surface;

forming a sidewall spacer on the vertical surface;

implanting second-conductivity-causing material into the surface of the substrate adjacent to the sidewall spacer to form a second region of the second conductivity in the substrate spaced from the vertical surface;

causing a portion of the dopant material to migrate to a third region of the substrate under the undercut region via the polysilicon in the undercut region; and causing lateral expansion of the first and third regions to cause the merger thereof whereby electrical contact is made between the first portion of polysilicon and the second region in the substrate.

* * * * *